(12) United States Patent
Balkan

(10) Patent No.: US 9,639,648 B2
(45) Date of Patent: May 2, 2017

(54) GOAL-BASED CELL PARTITIONING IN THE PRESENCE OF OBSTACLES

(71) Applicant: Synopsys, Inc., Mountain View (CA)

(72) Inventor: Aydin O. Balkan, Hayward, CA (US)

(73) Assignee: SYNOPSYS, INC., Mountain View, CA (US)

( * ) Notice: Subject to any disclaimer, the term of this patent is extended or adjusted under 35 U.S.C. 154(b) by 20 days.

(21) Appl. No.: 14/664,648

(22) Filed: Mar. 20, 2015

(65) Prior Publication Data

US 2015/0269301 A1    Sep. 24, 2015

Related U.S. Application Data

(60) Provisional application No. 61/968,948, filed on Mar. 21, 2014.

(51) Int. Cl.
*G06F 17/50*    (2006.01)

(52) U.S. Cl.
CPC .............................. *G06F 17/5072* (2013.01)

(58) Field of Classification Search
USPC ......................................................... 716/122
See application file for complete search history.

(56) References Cited

U.S. PATENT DOCUMENTS

| 7,685,540 B1* | 3/2010 | Madden | .............. | G06F 17/5077 |
| | | | | 716/118 |
| 2003/0079192 A1* | 4/2003 | Cheong | ............... | G06F 17/5072 |
| | | | | 716/113 |

OTHER PUBLICATIONS

Hsiao et al. "Optimal Tile Partition for Space Region of Integrated Circuits Geometry", May 1993, IEE Proceedings E—Computers and Digital Techniques, vol. 140, Issue 3, pp. 145-153.*

* cited by examiner

*Primary Examiner* — Bryce Aisaka
(74) *Attorney, Agent, or Firm* — Park, Vaughan, Fleming & Dowler LLP; Laxman Sahasrabuddhe

(57) ABSTRACT

Systems and techniques are provided to correctly handle obstacles during cell partitioning, thereby preventing electronic design automation (EDA) tools from being subject to performance penalties during subsequent operations that are performed by the EDA tools on the cell partitions.

17 Claims, 6 Drawing Sheets

GOAL-BASED CELL PARTITIONING IN THE PRESENCE OF OBSTACLES

RELATED APPLICATION

This application claims priority to U.S. Provisional Patent Application No. 61/968,948, entitled "Goal-Based Cell Partitioning in Presence of Obstacles," by Aydin O. Balkan, filed on 21 Mar. 2014, the contents of which are herein incorporated by reference in their entirety for all purposes.

BACKGROUND

Technical Field

This disclosure relates to electronic design automation (EDA) tools. More specifically, this disclosure relates to goal-based cell partitioning in the presence of obstacles.

Related Art

Advances in process technology and a practically unlimited appetite for consumer electronics have fueled a rapid increase in the size and complexity of integrated circuit (IC) designs. The performance of EDA tools is very important because it reduces the time to market for IC designs. Layout verification is an important stage in an EDA design flow that involves performing design rule check (DRC) and layout versus schematic (LVS) check on the circuit design layout.

Unfortunately, due to the rapid increase in the size and complexity of IC designs, conventional layout verification tools can require a very long time to perform verification.

SUMMARY

Partitioning a large cell into multiple smaller cells increases the scalability of EDA tools (e.g., layout verification tools) because the smaller cells can be processed concurrently using multiple processors. When partitioning a parent cell to create smaller child cells, special care needs to be taken for certain objects, called "obstacles," inside the parent cell. Specifically, if the obstacles are not handled correctly during cell partitioning, the performance of EDA tools (e.g., layout verification tools) can degrade instead of improving. Embodiments described herein correctly handle the obstacles during cell partitioning, thereby preventing EDA tools (e.g., layout verification tools) from being subject to performance penalties during subsequent operations that are performed by the EDA tools on the cell partitions.

DETAILED DESCRIPTION

Figure 1:
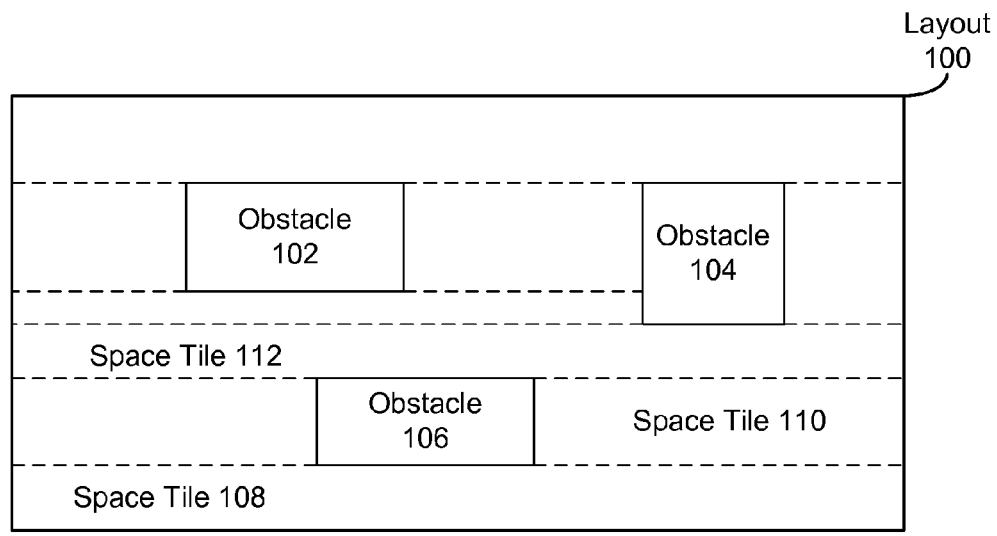
FIG. 1 illustrates an example of how obstacles and space tiles can be represented using the corner stitching data structure in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

EDA Design Flow

An EDA design flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., System Verilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical or layout verification, the circuit design can be checked to ensure that there are no manufacturing, electrical, or lithographic issues (i.e., no design rules are violated), and that the circuitry in the lithography masks matches the circuitry in the circuit design schematic (i.e., the lithography versus schematic check passes).

During resolution enhancement, geometric manipulations can be performed on the layout to improve manufacturability of the design. During mask data preparation, the design can be "taped-out" to produce masks, which are used during fabrication.

Overview

EDA tools, such as layout verification tools, divide the layout into buckets called "cells" and process the data in these buckets. These cells are treated as a basic unit by EDA tools and the performance of the EDA tools is based on certain characteristics of these cells. By partitioning cells into smaller cells, the overall performance of EDA tools, such as layout verification tools, can be improved.

When partitioning a parent cell into smaller cells, special care needs to be taken to handle certain objects (called "obstacles" in this disclosure). Specifically, if the obstacles are not handled correctly during cell partitioning, the performance of EDA tools can degrade instead of improving. The term "obstacle," as used in this disclosure, generally refers to a rectangular region within a cell layout that cannot be divided into smaller pieces when the cell layout is partitioned. In other words, each obstacle must either be entirely within a partition or entirely outside a partition. The obstacle may cover one or more objects (e.g., polygons, subcells, etc.) within a cell layout. Note that an obstacle can be viewed as a partitioning constraint.

There are many reasons why it may make sense to create one or more obstacles in a cell layout to constrain partitioning. For example if a partition line goes through a large subcell, it may reduce the performance of a DRC application, and so in this case, it may make sense to create an obstacle that covers the large subcell. Another example would be in LVS where some cells are marked as "blackbox" cells. It may make sense to create obstacles in the layout that cover such "blackbox" cells during partitioning, so that these cells are not "cut" during partitioning. As yet another example, consider an especially dense or critical area of shapes in the cell layout. It might make sense to create an obstacle that covers such areas in the cell layout. It will be clear from these examples that there could be many situations where it makes sense to create such "undividable regions" within the cell area that are not to be divided into smaller pieces during partitioning. Existing partitioning techniques are unable to efficiently and optimally partition a cell layout while ensuring that any obstacles specified in the cell layout remain undivided during partitioning. In contrast to existing techniques, embodiments described herein are able to efficiently and optimally partition a cell layout while ensuring that any obstacles specified in the cell layout remain undivided during partitioning.

Some embodiments described herein represent the set of desirable characteristics for the cell partitions as a set of mathematical "goal" functions. The special handling required by obstacles is also represented by similar goal functions. Next, a graph is formed with all solution candidates connected by a neighborhood relation. The embodiments then perform a search operation on the graph to find a good cell partition that satisfies the goal functions and correctly handles the obstacles. The process is repeated to find additional partitions with similar characteristics.

Some embodiments described herein can optimize cells that cause performance bottlenecks, regardless of existence, count or pattern of any obstacles. Specifically, the embodiments reduce runtime memory usage of the layout verification tool (i.e., as compared to the memory usage if the cells were not partitioned or if the cells were partitioned using existing partitioning approaches), and increase scalability by partitioning bottleneck-cells into smaller cells with desirable characteristics, while preserving any obstacles present in them. Processing smaller cells reduces the memory usage of layout verification tools because they require fewer data objects to be held in memory at once. Partitioning a large cell into multiple smaller cells increases the scalability of layout verification tools because the smaller cells can be processed concurrently using multiple processors. Embodiments described herein correctly handle the obstacles during cell partitioning, thereby preventing the layout verification tool from being subject to performance penalties during subsequent operations (e.g., during DRC and LVS checking operations).

Goal-Based Cell Partitioning

The two-dimensional coordinate system used in this disclosure uses integer values, e.g., 0, 1, 2, 3, etc. A point in the two-dimensional coordinate system consists of an integer value for the X-coordinate followed by an integer value for the Y-coordinate. In this disclosure, a cell is generally any layout object that contains polygons, and optionally contains instances of other cells. Each cell has a bounding box, which is the shape of a rectangle. All polygons and bounding boxes of instances of other cells that are within a given cell must be contained within the bounding box of the given cell. An obstacle is a layout object that has rectangular boundaries. If a cell contains an obstacle, the bounding box of the obstacle must be contained within the bounding box of a cell. A partition of cell is a rectangular area fully contained within the cell.

The memory usage of a layout verification tool is primarily determined by the amount of data in the cell that is currently being processed. Some layout verification tools partition cells that are placed only once in the circuit design using globally (i.e., external to the cell) determined horizontal cut lines. Cells that are placed more than once in the circuit design need to be partitioned based on local (internal to the cell) constraints. The quality of these partitions impacts the performance of most subsequent operations. Specifically, partition size impacts memory usage. Therefore, it is preferable if partitions are evenly sized so that no single partition heavily dominates memory usage and diminishes the value of other partitions.

Overlap between hierarchical components in a cell reduces performance because the overlapping data needs to be revisited again and resolved at a higher level of hierarchy. The same performance implication also holds for overlap between partitions; and also between partitions and hierarchical components of the cell. Therefore, it is preferable if partitions are created with minimal additional overlap with each other or other significant hierarchical components in the cell. Furthermore, a balanced distribution of data can also improve concurrency when each partition is processed by a different processor in a multi-processor computer.

A formal problem definition for cell partitioning can be described as follows. Given (1) a cell C, (2) a finite and possibly empty set of rectangular obstacles O, and (3) a finite set of desired partition characteristics (e.g., expected area of each partition), the cell partitioning problem is to generate a finite set of rectangular partitions $P_C=\{p_1, p_2, \ldots, p_k\}$, where each partition satisfies desired characteristics and each partition may abut or fully contain an obstacle, but it may not partially overlap with an obstacle. Some embodiments that solve the above-described cell partitioning problem have three main features: (1) a set of goal functions that mathematically describe the desired characteristics of each partition (e.g., one of the goal functions may represent the desired characteristic that each partition should be roughly the same size), (2) a set of search states, each of which can be assigned a score based on goal functions, and (3) a search process that is capable of searching the search states and identifying the state with the highest score. In the following paragraphs, each of these features will be described in further detail.

A goal function can generally be any function that generates a value for a given partition. For example, any function $g(p): P_C \rightarrow [0,1]$ that maps a given partition p belonging to the set of partitions $P_C$ to a real value between 0 and 1 (both inclusive) can be used as a goal function. In some embodiments, the cell partitioning can be performed using a set of goal functions $G=\{g_1, g_2, \ldots, g_n\}$.

Many goal functions can be created based on the desired characteristics of partitions. For example, consider the following desired characteristic: the ratio of the area of partition p with respect to the cell is within a tolerance T of a target area value A. Based on this desired characteristic, the following goal function can be created. Let $r_C(p): P_C \rightarrow R$ be a function that returns the area ratio of partition p with respect to parent cell C. Then, the following goal function can be created to represent the above-described desired characteristic:

$$g_{Area}(p) = \begin{cases} 1 - \frac{1}{T}|r_C(p) - A| & \text{if } A - T < r_C(p) < A + T. \\ 0 & \text{otherwise.} \end{cases} \quad (1)$$

As another example, consider the following desired characteristic for partition p: given a finite set of m rectangular obstacles $O=\{o_1, o_2, \ldots, o_m\}$ within the cell C, the partition p must not overlap with any of these obstacles. This desired characteristic can be represented as a goal function as follows. Let $v(p,o): P_C \times O \rightarrow R$ be a function that computes the overlap area between partition p and obstacle o and returns a real number value that represents the extent of the overlap, e.g., suppose the function $v(p,o)$ returns 0 if there is no overlap between partition p and obstacle o, and returns a non-zero value that represents the extent of overlap between partition p and obstacle o. Then, the following goal function can be created to represent the above-described desired characteristic:

$$g_{Obstacle}(p) = \begin{cases} 1 & \text{if } \sum_{o \in O} v(p, o) = 0. \\ 0 & \text{otherwise.} \end{cases} \quad (2)$$

According to one definition, a search state s consists of distinct points $z_1$ and $z_2$ that are contained within cell C, such that both X and Y coordinates of $z_2$ are greater than the respective coordinates of $z_1$. Let $p_s$ be a partition defined by the two points of the search state s such that $z_1$ is the left-bottom corner and $z_2$ is the right-top corner of $p_s$. A score can be assigned to a search state by multiplying the individual goal function values for a given partition. In this example, we assume that each goal function returns a real number in the range [0,1] for a given partition. Specifically, a score $v(s)$ can be assigned to search state s based on a set of goal functions G using the following expression:

$$v(s) = \prod_{g \in G} g(p_s). \quad (3)$$

If we use the two-dimensional coordinate system described above, then there is finite number of possible states in a cell. If we assume that the coordinates of the left-bottom corner of cell C's bounding box are (0,0) and its right-top corner has coordinates (w,h), then the number of possible states in cell C can be computed by the following expression:

$$\text{number of possible states in } C = \sum_{z_{2x}=1}^{w} \sum_{z_{2y}=1}^{h} z_{2x} z_{2y} = \frac{1}{4} w(w-1) h(h-1). \quad (4)$$

Asymptotically, the cell C has $\Theta(wh)$ state points and $\Theta((wh)^2)$ possible states, wherein "$\Theta(\bullet)$" is the big-O notation that is used in complexity theory. Therefore, some embodiments may need to consider $\Theta((wh)^2)$ states to identify the state that has the optimal score.

Some embodiments described herein can significantly reduce the number of states that the search process needs to consider to identify the state with the optimal score. Specifically, some embodiments can reduce the number of states that need to be considered from $\Theta((wh)^2)$ to $\Theta(m^2)$, where m is the number of obstacles plus a constant number, by representing the cell C and the set of obstacles O using tiles and the corner stitching data structure described in Ousterhout, J. K., "Corner Stitching: A Data Structuring Technique for VLSI Layout Tools," Retrieved January 2014, from Technical Reports, EECS at UC Berkeley (http://www-w.eecs.berkeley.edu/Pubs/TechRpts/1983/CSD-83-114.pdf), which is herein incorporated by reference in its entirety for all purposes.

Specifically, when using the corner stitching data structure, the bounding box of cell C can be represented as a rectangular layout consisting of a single space tile. Next, all obstacles can be inserted into this layout as solid tiles, so that in the final layout space tiles are as wide as possible, i.e., the left and right boundaries of any space tile are solid tiles or the border of the layout. In this representation, the total number of space and solid tiles in the layout is $\Theta(N)$, where N is the number of inserted obstacles. In the corner stitching data structure, the left-bottom and right-top corners of each tile are "stitched" to their neighbors via pointers.

FIG. 1 illustrates an example of how obstacles and space tiles can be represented using the corner stitching data structure in accordance with some embodiments described herein. Obstacles 102, 104, and 106 have been inserted into layout 100 as solid tiles. The remaining area in layout 100 is divided into space tiles, such as space tiles 108, 110, and 112. Note that the left and right boundaries of each space tile are either the boundary of layout 100 or the boundary of an obstacle.

In the above-mentioned corner stitching data structure, each tile can have four pointers that point to four neighboring tiles. Specifically, two pointers can correspond to the left-bottom corner of the tile, and two pointers can correspond to the right-top corner of the tile. For example, obstacle 106 (i.e., the solid tile corresponding to obstacle 106) can have four pointers, wherein two of the four pointers can correspond to the right-top corner of obstacle 106. Specifically, one of these two pointers can point to the space tile 112 (which is the top-side neighbor of obstacle 106) and the other can point to the space tile 110 (which is the right-side neighbor of obstacle 106).

Next, using a constant number of points (e.g., corners) from each tile as state points will reduce the number of state points to $\Theta(N)$. If there are no obstacles or very few obstacles (e.g., if the number of obstacles is fewer than a threshold), a constant number of state points can be added so that the total number of state points m is equal to N+O(1). Therefore, the number of states can be reduced to $\Theta(m^2)$ by representing obstacles using the corner stitching data structure.

A search state is defined by two points that mark a left-bottom corner and a right-top corner. Let $s(z_{LB}, z_{RT})$ denote a state where point $z_{LB}$ is the left-bottom corner and point $z_{RT}$ is the right-top corner. Let $z_0$ be a fixed point in the cell C, and let $Z=\{z_1, z_2, \ldots, z_m\}$ be the set of state points derived from the tile layout when the obstacles are inserted into the layout and the remaining area in the layout is divided into a set of space tiles as explained in reference to FIG. 1 (e.g., by using the corner stitching data structure).

Let $S_{z_0}=\{s_i | s_i = s(z_0, z_i)\}$ be the set of states that are defined by point $z_0$ and the points in set Z. Let $S_{neighbor}^{(s_i(z_0, z_i))}$ be the set of states $s_j$ that are defined as the neighbors of state $s_i$, where $S_{neighbor}^{(s_i(z_0, z_i))} = \{s_j(z_0, z_j) | z_i \text{ and } z_j \text{ are points on the same tile or on tiles that touch on any edge}\}$. In other words, two states are neighbors if the top-right corners of these states are either two points selected from the same tile (e.g., two corners of the same tile) or they are selected from two tiles that are touching each other.

Figure 2:
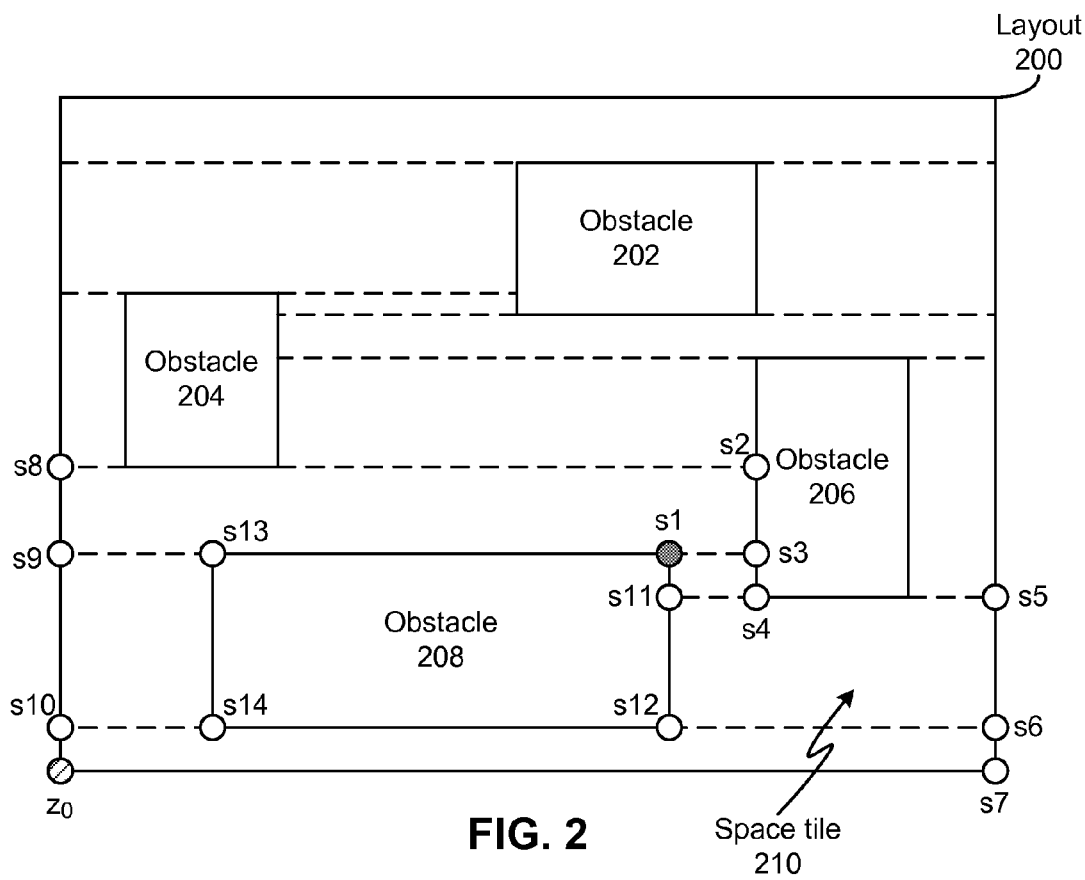
FIG. 2 illustrates states and neighbors of states in accordance with some embodiments described herein.

FIG. 2 illustrates states and neighbors of states in accordance with some embodiments described herein. Obstacles 202, 204, 206, and 208 have been inserted into layout 200, and space tiles have been created as described in reference to FIG. 1. Point $z_0$ is the left-bottom corner of layout 200. The set $Z=\{z_1, z_2, \ldots, z_m\}$ includes all tile corners, such as right-top corner of obstacle 208. In FIG. 2, set $S_{z_0}$ is the set of states that are defined by point $z_0$ and the points in set Z. For example, state s1 is an element of set $S_{z_0}$, and corresponds to the state defined by point $z_0$ and the right-top corner of obstacle 208. The neighboring states of state s1 are also shown in FIG. 2 by unshaded circles. Specifically, states s2-s14 correspond to states that are defined by point $z_0$ and a corner of obstacle 208 or that are defined by point $z_0$ and a corner of a tile that touches obstacle 208. Specifically, note that four space tiles touch obstacle 208, and states s2-s14 correspond to the corners of these four space tiles. For example, state s6 is defined by point $z_0$ and the right-bottom corner of space tile 210.

The state graph with fixed left-bottom corner at point $G_{z_0}$ is made of vertices, which represent point $z_0$ and elements of $S_{z_0}$, and edges between vertices that represent states $s_i(z_0, z_i)$ and $s_j \in S_{neighbor}^{(s_i(z_0, z_i))}$ and also from the vertex corresponding to the fixed point to the vertices that represent states. For example, the state graph corresponding to FIG. 2 comprises vertices that correspond to states s1-s14, and edges exist between the vertex that corresponds to state s1 and vertices that corresponds to states s2-s14 because states s2-s14 are neighbors of state s1.

Figure 3:
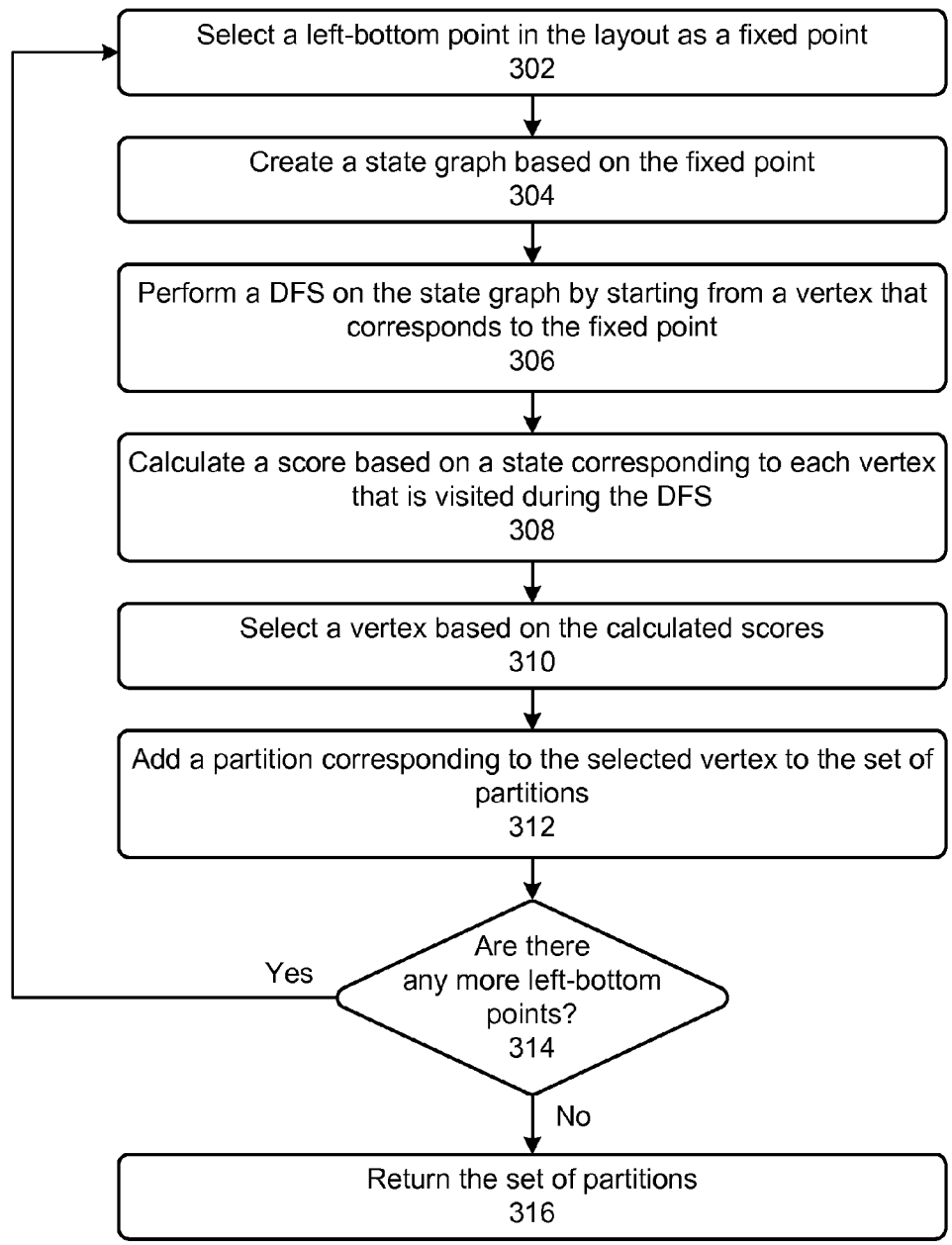
FIG. 3 illustrates a process that can be used to determine a set of partitions based on a state graph in accordance with some embodiments described herein.

FIG. 3 illustrates a process that can be used to determine a set of partitions based on a state graph in accordance with some embodiments described herein. The process can begin with selecting a left-bottom point in the layout as a fixed point (operation 302). Next, the process can create a state graph based on the fixed point (operation 304) as explained above. The process can then perform a depth first search (DFS) on the state graph by starting from a vertex that corresponds to the fixed point (operation 306). Then, the process calculates a score (e.g., by using Equation (3)) based on a state corresponding to each vertex that is visited during the DFS (operation 308). Next, the process can select a vertex based on the calculated scores (operation 310), and add a partition corresponding to the selected vertex to the set of partitions (operation 312). In some embodiments, the process can compute the scores for all vertices visited during the DFS, and then select the vertex with the highest score. In other embodiments, the process can terminate the DFS as soon as a vertex is found whose score is above a given threshold.

In some cases, operation 310 may not select any vertex, e.g., because the scores for all vertices were below a given threshold. In these cases, the process may select another left-bottom point as the fixed point. For example, suppose the process selects point z0 as the fixed point in operation 302, but is then unable to select a vertex based on the calculated scores in operation 310 (e.g., because none of the scores were above a score threshold). In this case, after taking the "Yes" branch back to operation 302, the process may select point s10, or s14, or any other point in the set of points that is not within any of the partitions in the set of partitions as the fixed point. (The term "left-bottom point" in operation 302 refers to the fact that this point is the left-bottom corner of the candidate partitions that are evaluated by the process illustrated in FIG. 3.)

In any case, once a partition has been added to the set of partitions, the process can then check if more left-bottom points can be selected in the layout (operation 314). If so, the process can go back to operation 302 and select the next left-bottom point and determine the next partition to add to the set of partitions. Otherwise, if no more left-bottom points can be selected, the process can terminate and return the set of the partitions (operation 316).

Figure 4A:
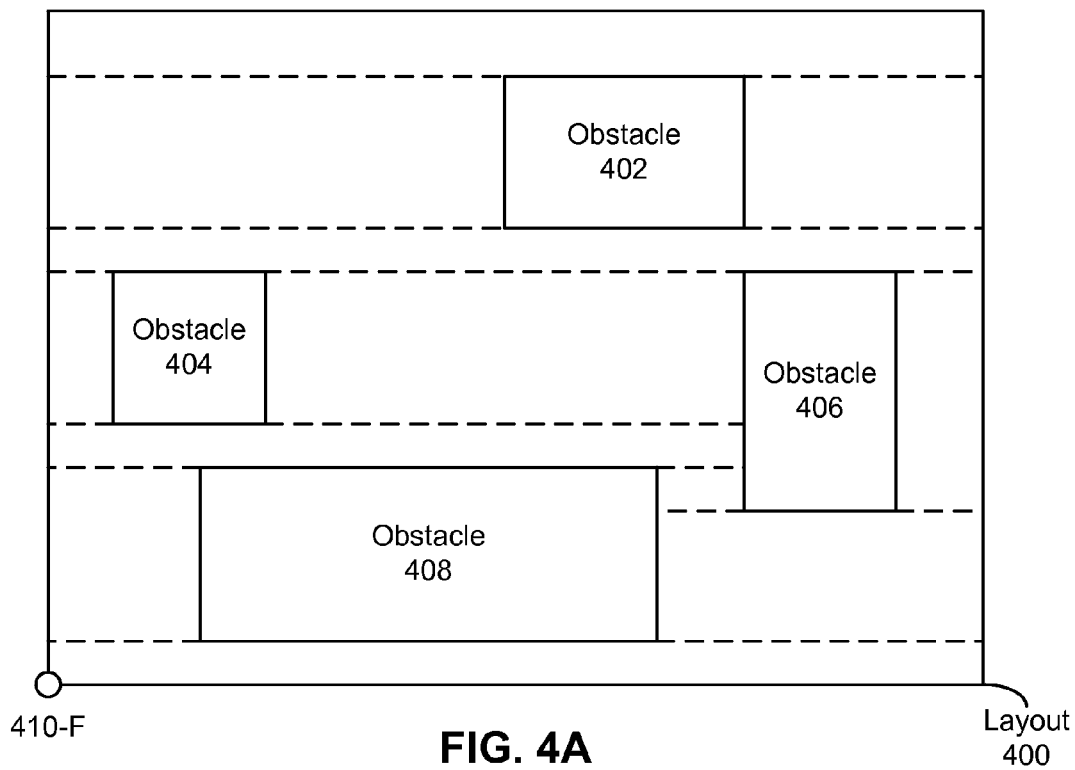
FIGS. 4A-4E illustrate how a set of partitions can be determined in accordance with some embodiments described herein.
Figure 4B:
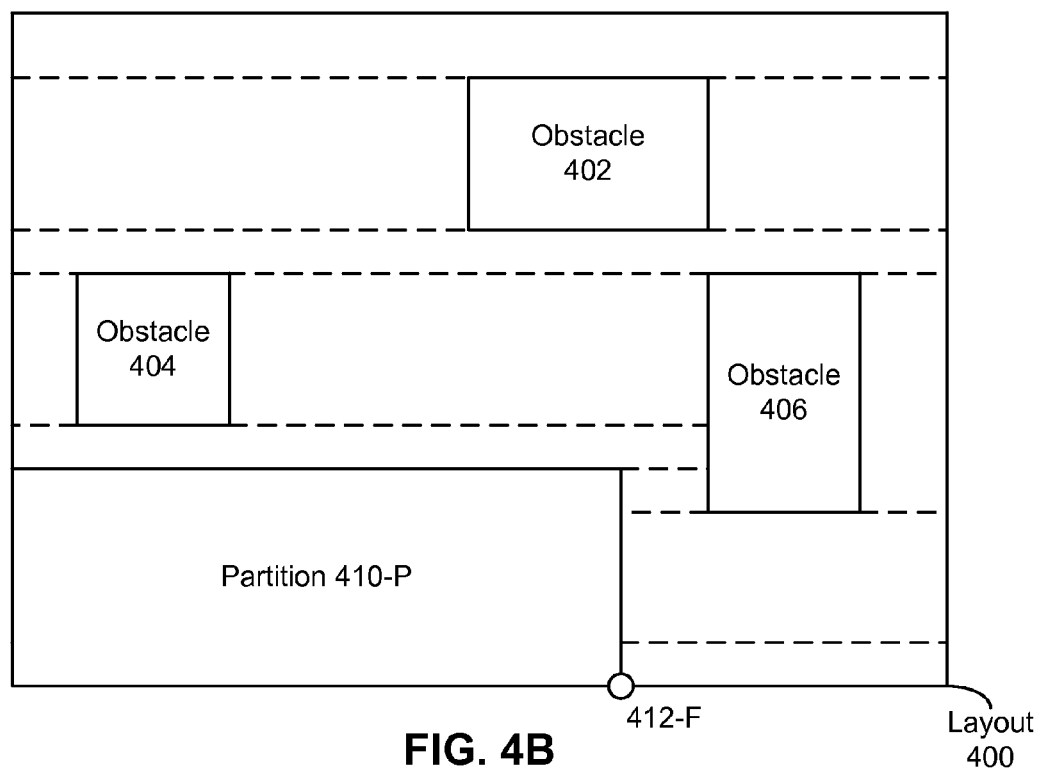
Figure 4C:
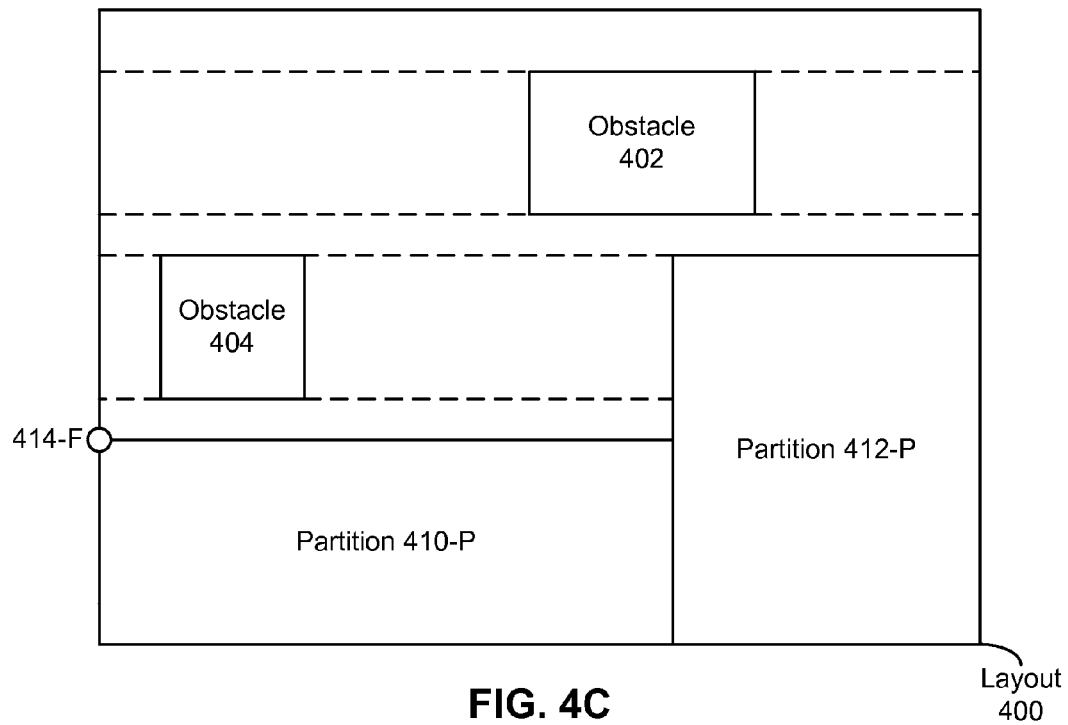
Figure 4D:
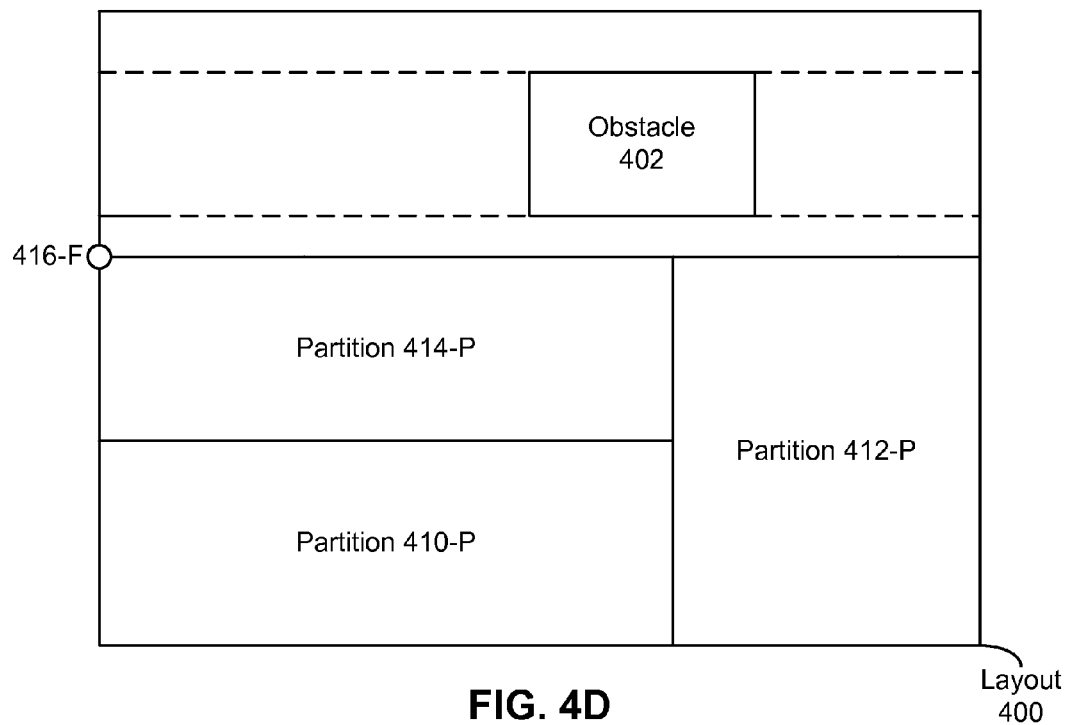
Figure 4E:
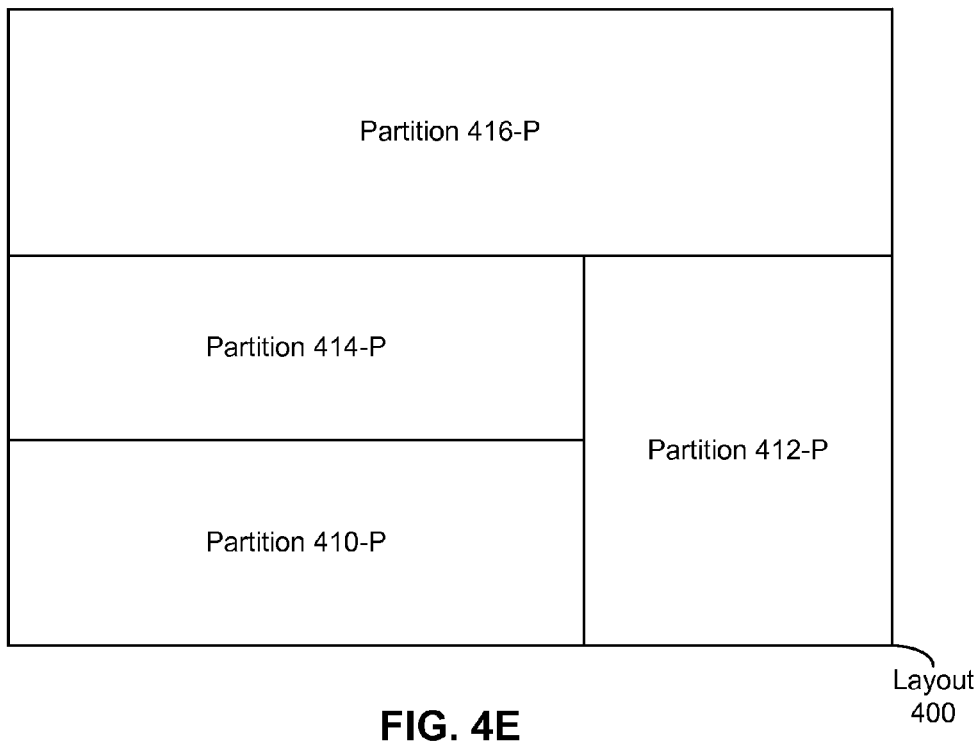

FIGS. 4A-4E illustrate how a set of partitions can be determined in accordance with some embodiments described herein. Layout 400 can include obstacles 402, 404, 406, and 408. The obstacles can be inserted into layout 400, and space tiles can be created as described in reference to FIG. 1. As shown in FIG. 4A, the left-bottom point in layout 400 can be selected as the fixed point 410-F, and a state graph can be created based on fixed point 410-F (e.g., by performing operations 302 and 304). Next, a suitable vertex in the state graph can be selected based on the scores (e.g., by performing operations 306, 308, and 310). Let us assume that the selected vertex corresponds to the state associated with the right-top corner of obstacle 408. Note that, as shown in FIG. 4B, partition 410-P corresponds to the state associated with the right-top corner of obstacle 408. The process can then add partition 410-P to the set of partitions (e.g., by performing operation 312).

Next, as shown in FIG. 4B, the process can select fixed point 412-F (e.g., by performing operation 314, taking the "Yes" branch, and performing operation 302). The process can then add partition 412-P shown in FIG. 4C (e.g., by performing operations 304, 306, 308, 310, and 312). Likewise, the process can select the next fixed point 414-F (shown in FIG. 4C), add partition 414-P (shown in FIG. 4D), select the next fixed point 416-F (shown in FIG. 4D), and add partition 416-P (shown in FIG. 4E). At this juncture, the process may determine that no more left-bottom points remain in the layout (e.g., the "No" branch of operation 314), and return the set of partitions {410-P, 412-P, 414-P, 416-P} as a solution to the goal-based cell partitioning problem (e.g., by performing operation 316).

Figure 5:
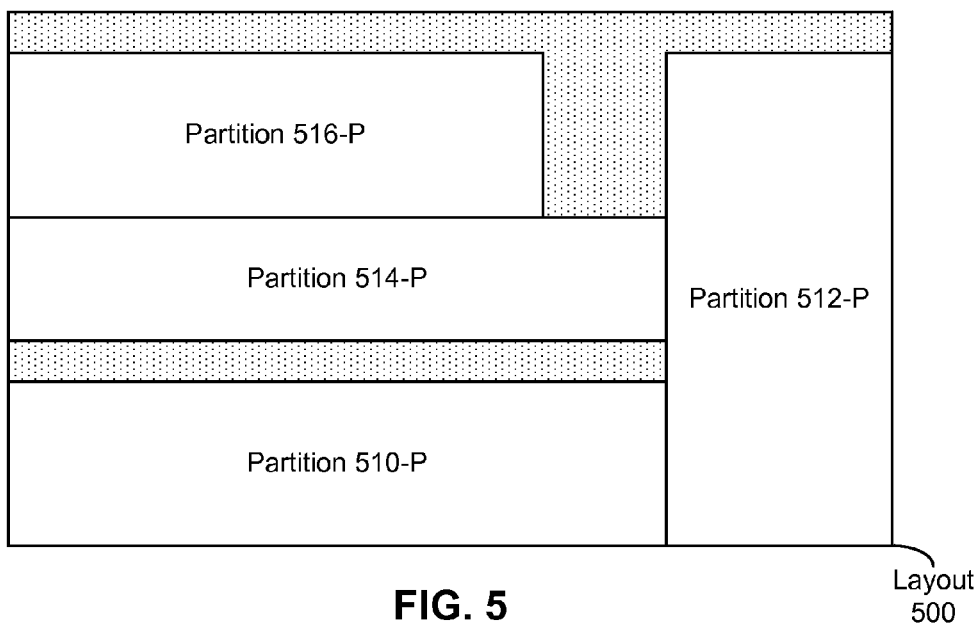
FIG. 5 illustrates an example of a set of partitions that does not cover the entire cell layout area in accordance with some embodiments described herein.

Note that the partitions in the set of partitions do not overlap with one another because of the manner in which the partitions are selected using the process illustrated in FIG. 3. In other words, the process illustrated in FIG. 3 creates partitions that are non-overlapping by construction. In the example shown in FIGS. 4A-4E, the entire cell area was covered by the set of partitions. However, in some cases, the set of partitions may not cover the entire cell layout area. In these cases, the area that is not part of any of the partitions is processed when the parent cell (i.e., the cell that is being partitioned) is processed. FIG. 5 illustrates an example of a set of partitions that does not cover the entire cell layout area in accordance with some embodiments described herein.

Layout 500 of a parent cell has been partitioned into partitions 510-P, 512-P, 514-P, and 516-P. Each of the partitions becomes a child cell of the parent cell, and the remaining area in layout 500 (i.e., the shaded area in layout 500) is retained in the parent cell itself. In other words, the child cells (i.e., the partitions 510-P, 512-P, 514-P, and 516-P) and the parent cell (i.e., the shaded area in layout 500) can be processed concurrently on separate processing cores by a layout verification tool.

The above process for determining a solution to a goal-based cell partitioning problem has been presented as an illustrative implementation. Various modifications to the disclosed embodiments will be readily apparent to those skilled in the art, and the general principles defined herein are applicable to other embodiments and applications without departing from the spirit and scope of the present disclosure. For example, in some variations, the process may rotate the layout before performing the process illustrated in FIG. 3. In some variations, the process may begin at a different corner, e.g., the left-top corner, and determine partitions by proceeding down and toward the right of the layout. In yet other variations, the process may perform the process illustrated in FIG. 3 on multiple rotated versions of the layout on different processor cores, and select the best partitioning solution from all of the partitioning solutions that were determined by the set of processor cores. In general, the embodiments described herein identify a set of points in the cell layout (e.g., a set of points that includes corners of obstacle tiles and space tiles), and then determine a set of partitions based on the set of points such that none of the partitions partially overlap with any of the obstacles.

Figure 6:
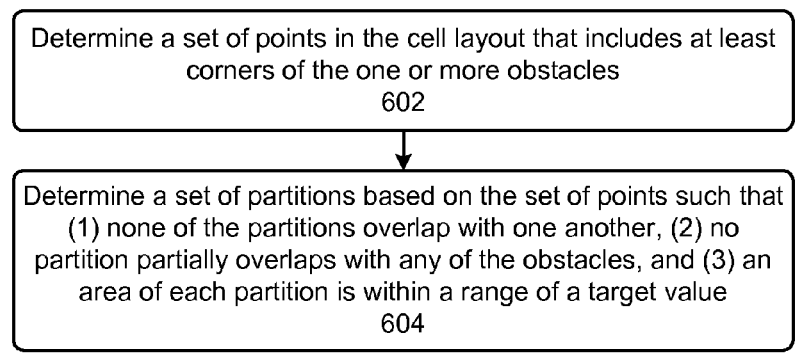
FIG. 6 illustrates a process to determine a set of partitions in accordance with some embodiments described herein.

FIG. 6 illustrates a process to determine a set of partitions in accordance with some embodiments described herein. The process can begin by determining a set of points that includes at least corners of the one or more obstacles (operation 602). Specifically, in some embodiments, determining the set of points in the cell layout can involve: representing the cell layout as a collection of obstacle tiles and space tiles, wherein each obstacle corresponds to an obstacle tile, and each boundary of a space tile either coincides with a boundary of an obstacle tile or with a boundary of the cell layout; and determining a union of all corners of obstacle tiles and space tiles. In some embodiments, the collection of obstacle tiles and space tiles is represented using a corner stitching data structure.

Next, the process can determine a set of partitions based on the set of points such that (1) none of the partitions overlap with one another, (2) no partition partially overlaps with any of the obstacles, and (3) an area of each partition is within a range of a target value (operation 604). In some embodiments, determining the set of partitions can involve: determining a set of candidate partitions based on the set of points; determining a score for each candidate partition by evaluating an objective function; selecting a candidate partition from the set of candidate partitions based on the scores; and adding the selected candidate partition to the set of partitions.

The objective function can include a product of multiple components. In some embodiments, one of the multiple components can include an area component that is maximized when an area of the candidate partition is equal to the target value, and minimized when the area of the candidate partition is outside of the range of the target value. In some embodiments, one of the multiple components includes an overlap component that is maximized when the candidate partition does not partially overlap with any of the obstacles, and minimized when the candidate partition partially overlaps with at least one obstacle.

Computer System

Figure 7:
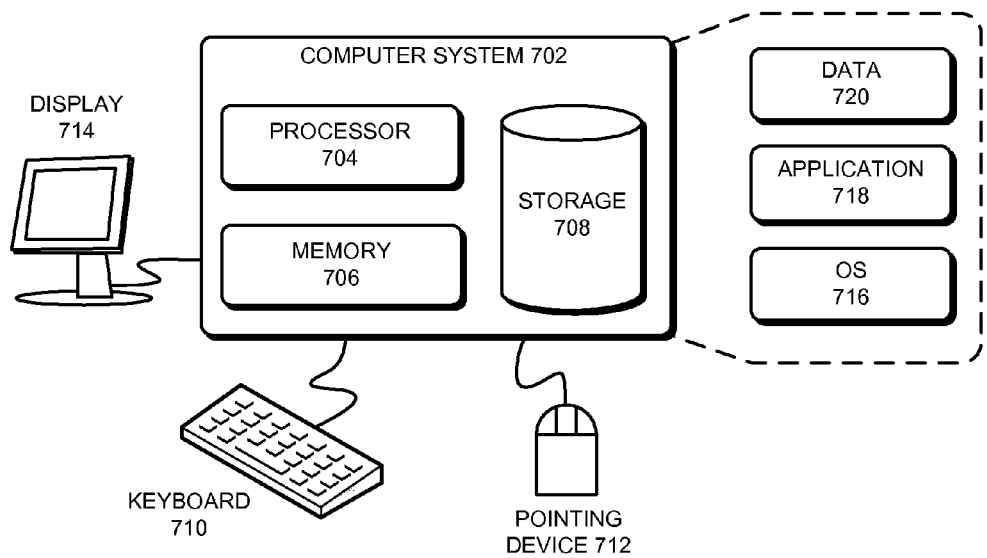
FIG. 7 illustrates a computer system in accordance with some embodiments described herein.

FIG. 7 illustrates a computer system in accordance with some embodiments described herein. Computer system 702 can include processor 704, memory 706, and storage device 708. Specifically, memory locations in memory 706 can be addressable by processor 704, thereby enabling processor 704 to access (e.g., via load/store instructions) and manipulate (e.g., via logical/floating point/arithmetic instructions) the data stored in memory 706. Computer system 702 can be coupled to display device 714, keyboard 710, and pointing device 712. Storage device 708 can store operating system 716, application 718, and data 720. Data 720 can include input required by application 718 and/or output generated by application 718.

Computer system 702 may automatically (or with user intervention) perform one or more operations that are implicitly or explicitly described in this disclosure. For example, computer system 702 can load application 718 (e.g., an EDA tool) into memory 706, and application 718 can then be used to partition cells using techniques described herein.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool, a method for partitioning a cell layout in the presence of one or more obstacles in the cell layout, the method comprising:
   determining a set of points in the cell layout that includes at least corners of the one or more obstacles; and
   determining a set of partitions based on the set of points such that (1) none of the partitions overlap with one another, (2) no partition partially overlaps with any of the obstacles, and (3) an area of each partition is within a range of a target value, wherein said determining the set of partitions includes iteratively performing at least the following set of operations:
      determining a set of candidate partitions based on the set of points;
      determining a score for each candidate partition by evaluating an objective function;
      selecting a candidate partition from the set of candidate partitions based on the scores; and
      adding the selected candidate partition to the set of partitions.

2. The method of claim 1, wherein the objective function includes a product of multiple components.

3. The method of claim 2, wherein one of the multiple components includes an area component that is maximized when an area of the candidate partition is equal to the target value, and minimized when the area of the candidate partition is outside the range of the target value.

4. The method of claim 2, wherein one of the multiple components includes an overlap component that is maximized when the candidate partition does not partially overlap with any of the obstacles, and minimized when the candidate partition partially overlaps with at least one obstacle.

5. The method of claim 1, wherein determining the set of points in the cell layout comprises:
   representing the cell layout as a collection of obstacle tiles and space tiles, wherein each obstacle corresponds to an obstacle tile, and each boundary of a space tile either coincides with a boundary of an obstacle tile or coincides with a boundary of the cell layout; and
   determining a union of all corners of obstacle tiles and space tiles.

6. The method of claim 5, wherein the collection of obstacle tiles and space tiles is represented using a corner stitching data structure.

7. A non-transitory computer-readable storage medium storing instructions for an electronic design automation (EDA) tool that, when executed by a computer, cause the computer to perform a method for partitioning a cell layout in the presence of one or more obstacles in the cell layout, the method comprising:
   determining a set of points in the cell layout that includes at least corners of the one or more obstacles; and
   determining a set of partitions based on the set of points such that (1) none of the partitions overlap with one another, (2) no partition partially overlaps with any of the obstacles, and (3) an area of each partition is within a range of a target value, wherein said determining the set of partitions includes iteratively performing at least the following set of operations:
      determining a set of candidate partitions based on the set of points;
      determining a score for each candidate partition by evaluating an objective function;
      selecting a candidate partition from the set of candidate partitions based on the scores; and
      adding the selected candidate partition to the set of partitions.

8. The non-transitory computer-readable storage medium of claim 7, wherein the objective function includes a product of multiple components.

9. The non-transitory computer-readable storage medium of claim 8, wherein one of the multiple components includes an area component that is maximized when an area of the candidate partition is equal to the target value, and minimized when the area of the candidate partition is outside the range of the target value.

10. The non-transitory computer-readable storage medium of claim 8, wherein one of the multiple components includes an overlap component that is maximized when the candidate partition does not partially overlap with any of the obstacles, and minimized when the candidate partition partially overlaps with at least one obstacle.

11. The non-transitory computer-readable storage medium of claim 7, wherein determining the set of points in the cell layout comprises:
   representing the cell layout as a collection of obstacle tiles and space tiles, wherein each obstacle corresponds to an obstacle tile, and each boundary of a space tile either coincides with a boundary of an obstacle tile or coincides with a boundary of the cell layout; and
   determining a union of all corners of obstacle tiles and space tiles.

12. The non-transitory computer-readable storage medium of claim 11, wherein the collection of obstacle tiles and space tiles is represented using a corner stitching data structure.

13. An apparatus, comprising:
   a processor; and
   a non-transitory computer-readable storage medium storing instructions for an electronic design automation (EDA) tool that, when executed by the processor, cause the apparatus to perform a method for partitioning a cell layout in the presence of one or more obstacles in the cell layout, the method comprising:
      determining a set of points in the cell layout that includes at least corners of the one or more obstacles; and
      determining a set of partitions based on the set of points such that (1) none of the partitions overlap with one another, (2) no partition partially overlaps with any of the obstacles, and (3) an area of each partition is within a range of a target value, wherein said determining the set of partitions includes iteratively performing at least the following set of operations:
         determining a set of candidate partitions based on the set of points;
         determining a score for each candidate partition by evaluating an objective function;
         selecting a candidate partition from the set of candidate partitions based on the scores; and
         adding the selected candidate partition to the set of partitions.

14. The apparatus of claim 13, wherein the objective function includes a product of multiple components.

15. The apparatus of claim 14, wherein one of the multiple components includes an area component that is maximized when an area of the candidate partition is equal to the target value, and minimized when the area of the candidate partition is outside the range of the target value.

16. The apparatus of claim 14, wherein one of the multiple components includes an overlap component that is maximized when the candidate partition does not partially overlap with any of the obstacles, and minimized when the candidate partition partially overlaps with at least one obstacle.

17. The apparatus of claim 13, wherein determining the set of points in the cell layout comprises:
   representing the cell layout as a collection of obstacle tiles and space tiles, wherein each obstacle corresponds to an obstacle tile, and each boundary of a space tile either coincides with a boundary of an obstacle tile or coincides with a boundary of the cell layout, wherein the collection of obstacle tiles and space tiles is represented using a corner stitching data structure; and
   determining a union of all corners of obstacle tiles and space tiles.

* * * * *